United States Patent
Kim et al.

(10) Patent No.: US 12,199,226 B2
(45) Date of Patent: Jan. 14, 2025

(54) LIGHT EMITTING PACKAGE FREE OF WAVELENGTH CONVERSION MATERIAL

(71) Applicant: SEOUL SEMICONDUCTOR CO., LTD., Ansan-si (KR)

(72) Inventors: Myung Jin Kim, Ansan-si (KR); Kwang Yong Oh, Ansan-si (KR)

(73) Assignee: Seoul Semiconductor Co., Ltd., Ansan-si (KR)

(*) Notice: Subject to any disclaimer, the term of this patent is extended or adjusted under 35 U.S.C. 154(b) by 0 days.

(21) Appl. No.: 18/181,970

(22) Filed: Mar. 10, 2023

(65) Prior Publication Data

US 2023/0215994 A1    Jul. 6, 2023

Related U.S. Application Data

(63) Continuation of application No. 16/943,144, filed on Jul. 30, 2020, now Pat. No. 11,605,763, which is a continuation of application No. PCT/KR2019/018786, filed on Dec. 31, 2019.

(30) Foreign Application Priority Data

Jan. 4, 2019   (KR) .................. 10-2019-0001181

(51) Int. Cl.
   *H01L 33/56*   (2010.01)
   *H01L 33/50*   (2010.01)
(52) U.S. Cl.
   CPC ............ *H01L 33/56* (2013.01); *H01L 33/507* (2013.01); *H01L 2933/005* (2013.01)

(58) Field of Classification Search
   CPC .. H01L 33/56; H01L 33/507; H01L 2933/005
   See application file for complete search history.

(56) References Cited

U.S. PATENT DOCUMENTS

| | | | |
|---|---|---|---|
| 9,893,250 B1* | 2/2018 | Ichikawa | ............... H01L 33/62 |
| 2014/0197436 A1 | 7/2014 | Kim | |
| 2015/0050760 A1 | 2/2015 | Imazu et al. | |
| 2016/0197247 A1 | 7/2016 | Kanaumi et al. | |
| 2017/0345982 A1* | 11/2017 | Abe | ...................... H01L 33/502 |

(Continued)

FOREIGN PATENT DOCUMENTS

| | | |
|---|---|---|
| EP | 2535954 A1 | 12/2012 |
| JP | 2006186165 A | 7/2006 |

(Continued)

OTHER PUBLICATIONS

Canadian Office Action from corresponding CA Patent Application No. 3,125,544, dated Nov. 3, 2022 (4 pages).

(Continued)

*Primary Examiner* — Jay C Chang
*Assistant Examiner* — Mikka Liu
(74) *Attorney, Agent, or Firm* — Perkins Coie LLP (57) ABSTRACT

A light emitting diode package is disclosed. The light emitting diode package includes a light emitting diode chip emitting light and a light transmissive member. The light transmissive member covers at least an upper surface of the light emitting diode chip and includes a light transmissive resin and reinforcing fillers. The reinforcing fillers have at least two side surfaces having different lengths and are dispersed in the light transmissive resin.

19 Claims, 3 Drawing Sheets

(56) References Cited

U.S. PATENT DOCUMENTS

| | | |
|---|---|---|
| 2017/0358720 A1 | 12/2017 | Hashimoto |
| 2019/0036078 A1* | 1/2019 | Niiyama .............. H10K 50/846 |
| 2019/0064595 A1 | 2/2019 | Tran et al. |
| 2020/0035796 A1 | 11/2020 | Kim et al. |

FOREIGN PATENT DOCUMENTS

| | | |
|---|---|---|
| JP | 2012222005 A | 11/2012 |
| JP | 2016-225581 | 12/2016 |
| KR | 10-2011-0094298 | 8/2011 |
| KR | 10-2012-0066321 | 6/2012 |
| KR | 10-1238013 | 2/2013 |
| KR | 10-2015-0008626 | 1/2015 |
| KR | 1020150030529 A | 3/2015 |

OTHER PUBLICATIONS

International Search Report for International Application PCT/KR2019/018786, mailed Apr. 14, 2020.
Examination Report issued to corresponding Indian Patent Application No. 202117033575, issued Feb. 25, 2022, 6 pages.
Extended European Search Report for corresponding European Patent Application No. 19906847.9, issued Sep. 28, 2021, 9 pages.
Office Action from corresponding Korean Patent Application No. 10-2019-0001181, dated Nov. 8, 2023 (4 pages).

* cited by examiner

LIGHT EMITTING PACKAGE FREE OF WAVELENGTH CONVERSION MATERIAL

CROSS-REFERENCE TO RELATED APPLICATIONS

This application is a continuation of U.S. patent application Ser. No. 16/943,144, filed on Jul. 30, 2020, which is a continuation of International Patent Application No. PCT/KR2019/018786, filed on Dec. 31, 2019, which claims priority to and the benefit of Korean Patent Application No. 10-2019-0001181, filed on Jan. 4, 2019. All the aforementioned application of which are incorporated by reference in their entireties.

TECHNICAL FIELD

Embodiments of the present disclosure relate to a light emitting diode package.

BACKGROUND

A light emitting diode emits light having various wavelengths through recombination of holes and electrons in a junction region of p-type and n-type semiconductors upon application of electric current thereto. Due to various advantages, such as longer lifespan, lower power consumption, and better operation characteristics than filaments used in a conventional light emitting apparatus, there is increasing demand for light emitting diodes.

A light emitting diode package adopting the light emitting diode is used as a light source in various fields, such as a backlight unit of a display device and the like.

The light emitting diode package employs a light transmissive resin covering a light emitting diode chip in order to protect the light emitting diode chip. Alternatively, the light emitting diode package may employ a light transmissive resin including a wavelength conversion material dispersed therein in order to convert wavelengths of light emitted from the light emitting diode chip.

In general, an epoxy resin or a silicone resin is used as the light transmissive resin. However, the light transmissive resin has a higher coefficient of thermal expansion than the light emitting diode chip.

Accordingly, the light transmissive resin undergoes significant expansion or contraction due to temperature variation of the light emitting diode chip or for other reasons. Since there is a significant difference in the degree of contraction or expansion due to temperature variation between the light emitting diode chip and the light transmissive resin, cracks may be generated in the light transmissive resin. When the cracks are generated in the light transmissive resin, the light emitting diode package and a display device including the light emitting diode package may suffer from deterioration in reliability.

SUMMARY

Embodiments of the present disclosure provide a light emitting diode package that has improved reliability by preventing generation of cracks. Embodiments of the present disclosure provide a light emitting diode package that minimizes deterioration in luminous efficacy while improving reliability.

In accordance with embodiments of the present disclosure, a light emitting diode package includes a light emitting diode chip emitting light and a light transmissive member. The light transmissive member covers at least an upper surface of the light emitting diode chip and includes a light transmissive resin and reinforcing fillers. The reinforcing fillers have at least two side surfaces having different lengths and are dispersed in the light transmissive resin.

According to other embodiments of the present disclosure, a light emitting diode package employs reinforcing fillers having a low coefficient of thermal expansion to prevent cracking in a light transmissive resin while improving reliability.

According to further other embodiments of the present disclosure, the light emitting diode package employs light transmissive reinforcing fillers to improve reliability while minimizing deterioration in luminous efficacy.

DETAILED DESCRIPTION OF EMBODIMENTS

Hereinafter, embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. Throughout the specification, like reference numerals denote like elements having the same or similar functions.

In accordance with embodiments of the present disclosure, a light emitting diode package includes: a light emitting diode chip emitting light and a light transmissive member. The light transmissive member covers at least an upper surface of the light emitting diode chip and includes a light transmissive resin and reinforcing fillers. The reinforcing fillers have at least two side surfaces having different lengths and are dispersed in the light transmissive resin.

In some embodiments, the reinforcing fillers may include one selected from the group of glass fibers formed of Si, Al, Fe, Ba, Ca, Mg and Na.

In other embodiments, the reinforcing fillers may include glass fibers formed of $SiO_2$, $Al_2O_3$, MgO, CaO, $Na_2O$, $K_2O$, or $B_2O_3$.

The reinforcing fillers may be present in an amount of 10% by weight (wt %) to 200 wt % relative to the light transmissive resin.

The reinforcing fillers may be present in an amount of 50 wt % to 100 wt % relative to the light transmissive resin.

According to one embodiment, the light transmissive member may cover upper and side surfaces of the light emitting diode chip.

The light emitting diode package may further include a barrier member covering a side surface of the light transmissive member and reflecting light emitted through the side surface of the light emitting diode chip.

The barrier member may further include the reinforcing fillers.

According to another embodiment, the light transmissive member may cover an upper surface of the light emitting diode chip.

The light emitting diode package may further include a barrier member covering a side surface of the light emitting diode chip.

The barrier member may further include the reinforcing fillers.

The light transmissive member may further cover an upper surface of the barrier member.

The barrier member may further cover a side surface of the light transmissive member.

The light transmissive member may further include a wavelength conversion material dispersed in the light transmissive resin.

Hereinafter, light emitting diode packages according to embodiments of the present disclosure will be described in detail with reference to the accompanying drawings.

Figure 1:
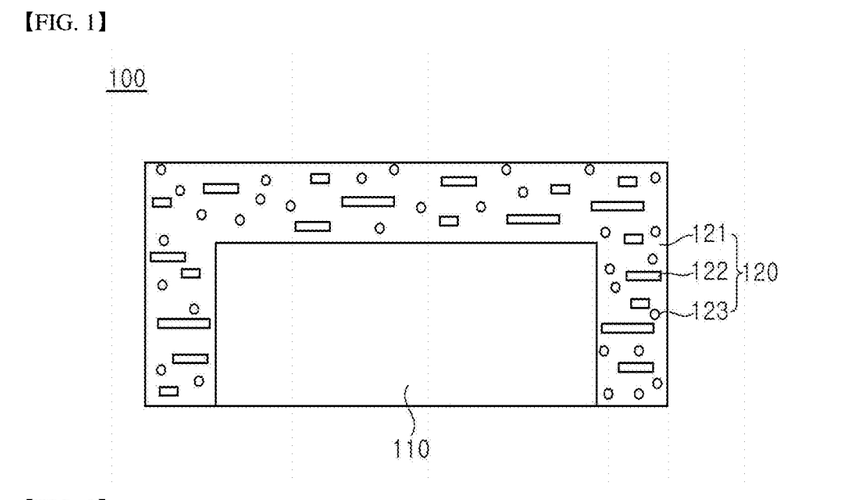
FIG. 1 illustrates a view of a light emitting diode package according to a first embodiment of the present disclosure.

FIG. 1 is a view of a light emitting diode package according to a first embodiment of the present disclosure.

The light emitting diode package 100 according to the first embodiment includes a light emitting diode chip 110 and a light transmissive member 120.

In some embodiments, the light emitting diode chip 110 includes a GaN-based semiconductor stack grown on a growth substrate for growth of semiconductor layers. The light emitting diode chip 110 emits UV light or visible light.

The light emitting diode chip 110 may include electrodes (not shown) on at least one of upper and lower portions thereof. For example, the electrodes may be formed at the upper portion of the light emitting diode chip 110 to be electrically connected to an external component by wire bonding. Alternatively, the electrodes may be formed at the lower portion of the light emitting diode chip 110 to be electrically connected to an external component by flip chip bonding. Further alternatively, the electrodes of the light emitting diode chip 110 may be formed at the upper and lower portions thereof, respectively, in which the electrode formed at the lower portion of the light emitting diode chip 110 is electrically connected to the external component by flip chip bonding and the electrode formed at the upper portion thereof is electrically connected to the external component by wire bonding.

The light transmissive member 120 covers a light emitting surface of the light emitting diode chip 110. For example, the light transmissive member 120 covers upper and side surfaces of the light emitting diode chip 110. With this structure, the light transmissive member 120 can protect the light emitting diode chip 110 from an external environment.

In some embodiments, the transmissive member 120 may be formed such that a portion covering the side surfaces of the light emitting diode chip 110 is thicker than a portion covering the upper surface of the light emitting diode chip 110. That is, a thickness D1 from the side surface of the light emitting diode chip 110 to the side surface of the transmissive member 120 is thicker than a thickness D2 from the upper surface of the light emitting diode chip 110 to the upper surface of the transmissive member 120.

The light transmissive member 120 includes a light transmissive resin 121, reinforcing fillers 122, and a wavelength conversion material 123. The reinforcing fillers 122 and the wavelength conversion material 123 are formed of light transmissive materials and dispersed in the light transmissive resin 121. If non-transmissive materials, such as typical metal fillers or carbon fillers, are dispersed in the light transmissive resin 121, luminous efficacy of the light emitting diode package can be deteriorated. Thus, the light emitting diode package 100 according to this embodiment can prevent or minimize deterioration in luminous efficacy using the reinforcing fillers 122, which are light transmissive.

For example, the light transmissive resin 121 may include one selected from the group of a silicone resin, an epoxy resin, and a polyimide resin. However, it should be understood that these materials are provided by way of example and the materials for the light transmissive resin 121 are not limited thereto. The light transmissive resin 121 may be a resin selected from any materials that allow transmission of light therethrough.

In some embodiments, the light transmissive resin 121 may have a higher coefficient of thermal expansion than the light emitting diode chip 110. Further, since the light transmissive resin 121 contacts the light emitting diode chip 110, light and heat emitted from the light emitting diode chip 110 are directly transferred to the light transmissive resin 121.

Accordingly, in a conventional light emitting diode package, the light transmissive resin is degraded by light and heat emitted from the light emitting diode chip and suffers from cracking. Reliability of the light emitting diode package is deteriorated due to intrusion of foreign matter, such as moisture, air, dust, and the like, into the light emitting diode package through cracks or due to discharge of light not subjected to wavelength conversion through the cracks.

Unlike the conventional light emitting diode package, the light emitting diode package 100 according to this embodiment includes the reinforcing fillers 122 dispersed in the light transmissive resin 121. The reinforcing fillers 122 prevent deterioration in reliability of the light emitting diode package due to difference in coefficient of thermal expansion between the light transmissive resin 121 and the light emitting diode chip 110.

The reinforcing fillers 122 has at least two side surfaces having different lengths. For example, the reinforcing fillers 122 may have an elongated rod structure having a major axis and a minor axis, as illustrated in FIG. 1.

The reinforcing fillers 122 may include one selected from the group of glass fibers formed of Si, Al, Fe, Ba, Ca, Mg and Na. For example, the reinforcing fillers 122 may include one selected from the group of glass fibers formed of $SiO_2$, $Al_2O_3$, MgO, CaO, $Na_2O$, $K_2O$ and $B_2O_3$.

In the light transmissive member 120, the reinforcing fillers 122 may be present in an amount of 10 wt % to 200 wt % relative to the light transmissive resin 121. Alternatively, in the light transmissive member 120, the reinforcing fillers 122 may be present in an amount of 50 wt % to 100 wt % relative to the light transmissive resin 121.

Glass fibers are resistant to heat and have a low coefficient of thermal expansion. In addition, the glass fibers are not affected by light and have good chemical resistance. Thus, the reinforcing fillers 122 formed of the glass fibers also have a low coefficient of thermal coefficient and exhibit good properties in terms of heat resistance and chemical resistance.

Since the reinforcing fillers 122 have a low coefficient of thermal expansion, it is possible to reduce the degree of expansion or contraction of the light transmissive resin 121 due to temperature variation. Accordingly, the reinforcing fillers 122 can prevent generation of cracks in the light transmissive resin 121. Further, the reinforcing fillers 122 can prevent foreign matter from entering the light transmissive resin 121 through cracks by preventing cracking of the light transmissive resin 121.

Further, since the reinforcing fillers 122 have an elongated rod structure, the reinforcing fillers 122 block a progression route of the cracks to prevent progression of the cracks. Furthermore, the reinforcing fillers 122 having an elongated rod structure can obstruct foreign matter from entering the light transmissive resin 121. Furthermore, even when foreign matter enters the light transmissive resin 121, the elongated rod structure of the reinforcing fillers 122 extends an infiltration route of the foreign matter.

As such, the light emitting diode package 100 according to this embodiment includes the reinforcing fillers 122 to improve heat resistance and chemical resistance of the light transmissive member 120, thereby improving reliability.

The wavelength conversion material 123 converts wavelengths of light emitted from the light emitting diode chip 110 such that the light emitting diode package 100 can emit light having a predetermined color. For example, the wavelength conversion material 123 may include phosphors or quantum dots (QD).

Although the light transmissive member 120 is illustrated as including the wavelength conversion material 123 in this embodiment, it should be understood that the light transmissive member 120 is not required to include the wavelength conversion material 123. If light emitted from the light emitting diode package 100 has the same wavelength band as light emitted from the light emitting diode chip 110, the wavelength conversion material 123 can be omitted.

When the light transmissive member 120 is not required to convert the wavelengths of light emitted from the light emitting diode chip 110, the light transmissive member 120 may not include the wavelength conversion material 123.

A first experimental group and a second experimental group are conventional light emitting diode packages 10, 20, respectively.

Figure 2:
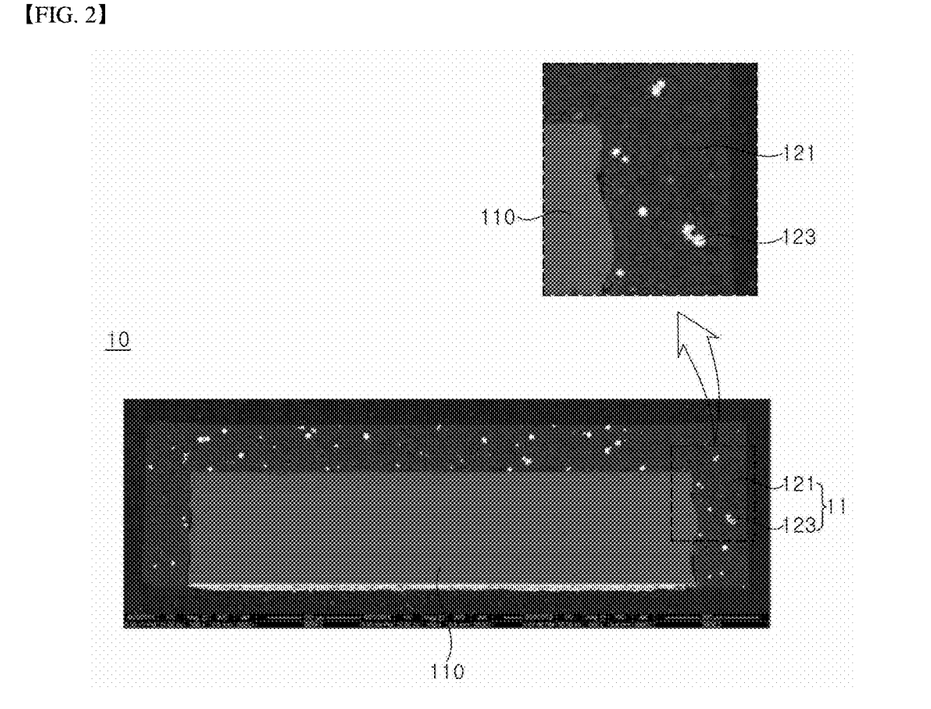
FIG. 2 illustrates scanning electron microscope (SEM) images of a conventional light emitting diode package.
Figure 3:
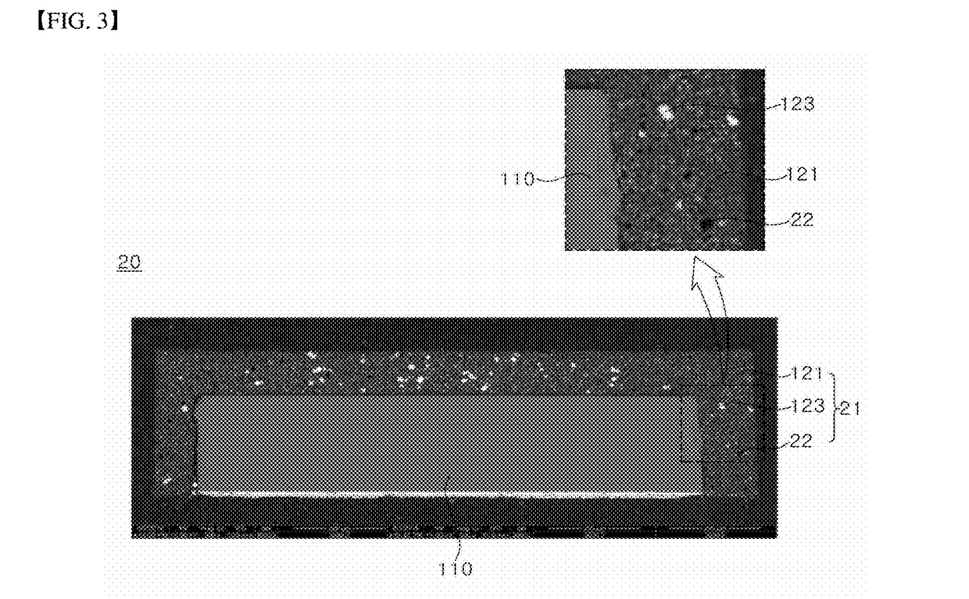
FIG. 3 illustrates scanning electron microscope (SEM) images of another conventional light emitting diode package including fillers.

FIG. 2 is an SEM image of the conventional light emitting diode package 10 corresponding to the first experimental group and FIG. 3 is an SEM image of the conventional light emitting diode package 20 corresponding to the second experimental group. The SEM images are pictures photographed by a scanning electron microscope.

Referring to FIG. 2, in the conventional light emitting diode package 10 corresponding to the first experimental group, a light transmissive member 11 includes a light transmissive resin 121 and a wavelength conversion material 123 dispersed in the light transmissive resin 121, and does not include fillers.

Referring to FIG. 3, in the conventional light emitting diode package 20 corresponding to the second experimental group, a light transmissive member 21 includes a light transmissive resin 121, a wavelength conversion material 123, and fillers 22. In the second experimental group, the fillers 22 have a general structure instead of the elongated rod structure of the reinforcing fillers 122 according to this embodiment and are present in an amount of 80 wt %. For example, the fillers 22 may be silica fillers.

Tables 1 and 2, which will be described below, show experimental results comparing reliability of conventional light emitting diode packages 10, 20 (shown in FIGS. 2 and 3) with reliability of the light emitting diode package 100 according to this embodiment. Third to seventh experimental groups are the light emitting diode packages 100 according to this embodiment.

Figure 4:
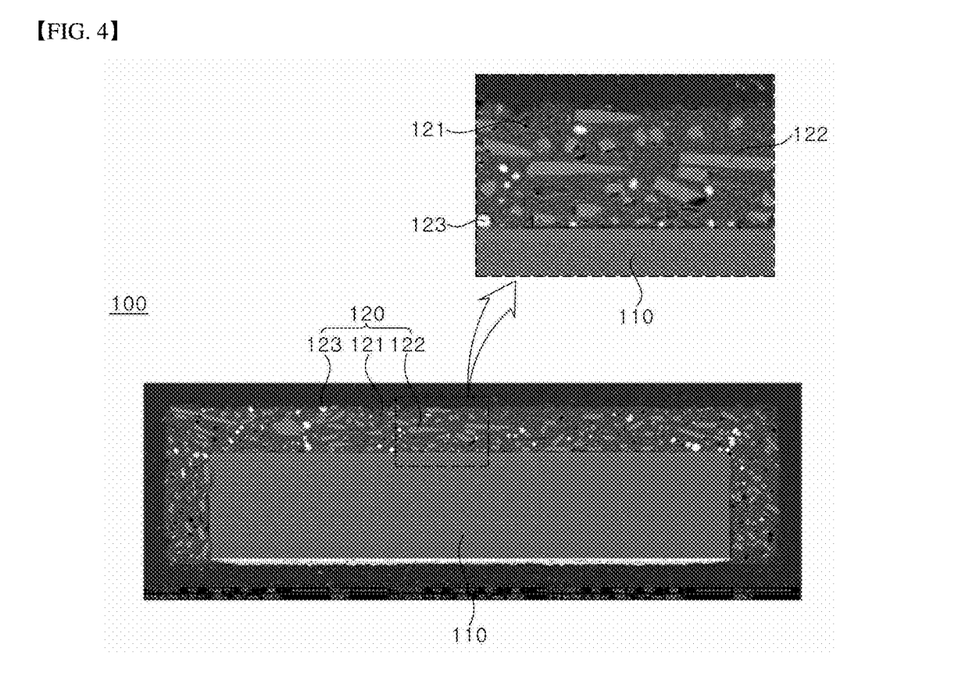
FIG. 4 is an SEM image of the light emitting diode package according to the first embodiment of the present disclosure.
Figure 5:
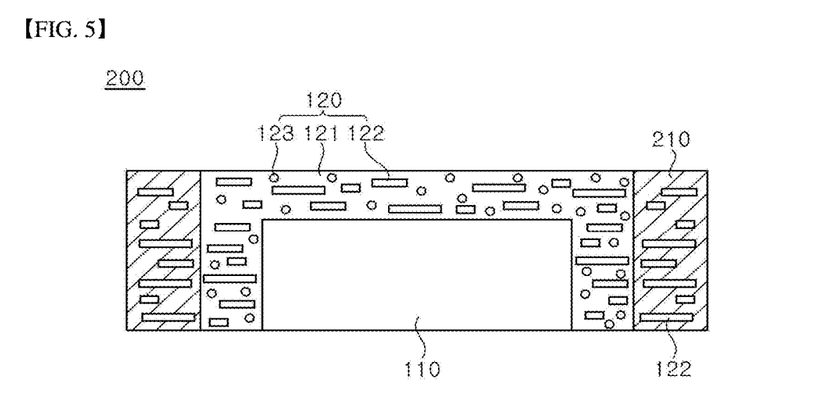
FIG. 5 illustrates a light emitting diode package according to a second embodiment of the present disclosure.
Figure 6:
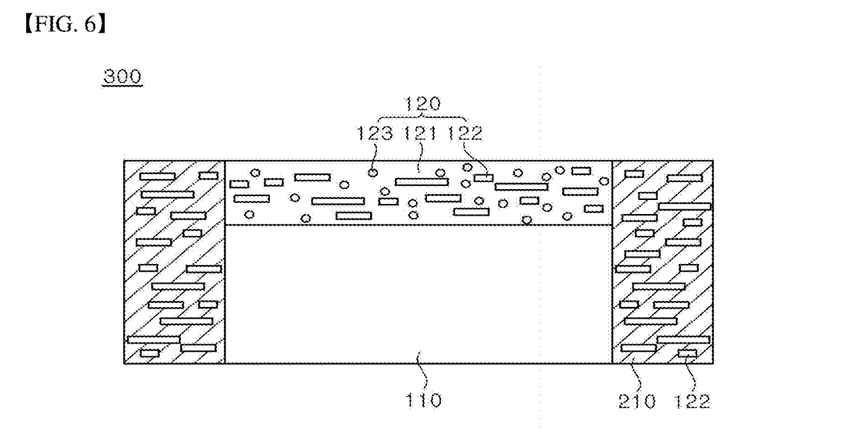
FIG. 6 illustrates a light emitting diode package according to a third embodiment of the present disclosure.
Figure 7:
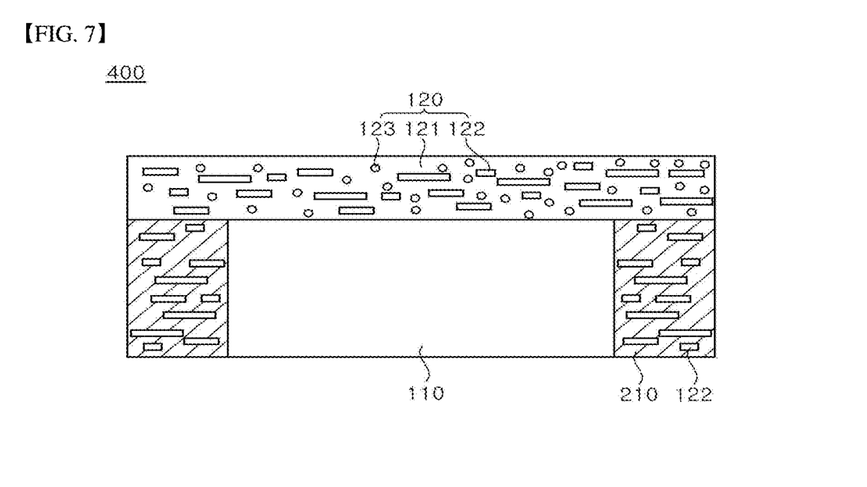
FIG. 7 illustrates a light emitting diode package according to a fourth embodiment of the present disclosure.

FIG. 4 is an SEM image of the light emitting diode package 100. FIG. 5 illustrates a light emitting diode package according to a second embodiment of the present disclosure. FIG. 6 illustrates a light emitting diode package according to a third embodiment of the present disclosure. FIG. 7 illustrates a light emitting diode package according to a fourth embodiment of the present disclosure.

In the light emitting diode package 100 according to this embodiment, the light transmissive member 120 includes the light transmissive resin 121, the wavelength conversion material 123, and the reinforcing fillers 122. The light transmissive member 120 is also included in the third to seventh experimental groups. The reinforcing fillers 122 have an elongated rod structure, as shown in FIG. 4.

The reinforcing fillers 122 are present in an amount of 5 wt % in the third experimental group, in an amount of 10 wt % in the fourth experimental group, in an amount of 50 wt % in the fifth experimental group, in an amount of 100 wt % in the sixth experimental group, and in an amount of 150 wt % in the seventh experimental group.

Table 1 shows experimental results comparing points of times at which cracks are generated in the light transmissive members 11, 21 of the conventional light emitting diode packages 10, 20 and the light transmissive member 120 of the light emitting diode package 100 according to this embodiment.

The experiment was performed while supplying an electric current of 1,000 mA to the light emitting diode chip 110 at 100° C. in each of the experimental groups.

TABLE 1

| Kind | Experimental time (hour) | | | | | | |
|---|---|---|---|---|---|---|---|
| | 500 | 1000 | 1500 | 2000 | 2500 | 3000 | 3500 |
| First experimental group | Pass | Crack | — | — | — | — | — |
| Second experimental group | Pass | Crack | — | — | — | — | — |
| Third experimental group | Pass | Crack | — | — | — | — | — |
| Fourth experimental group | Pass | Pass | Crack | — | — | — | — |
| Fifth experimental group | Pass | Pass | Pass | Pass | Crack | — | — |
| Sixth experimental group | Pass | Pass | Pass | Pass | Pass | Pass | Crack |
| Seventh experimental group | Pass | Pass | Pass | Pass | Pass | Pass | Crack |

Referring to Table 1, in all of the first experimental group, the second experimental group and the third experimental group, cracks were generated in the light transmissive members 11, 21, 120 when the experiment was performed for 1,000 hours. From this result, it can be seen that the general fillers 22 not having an elongated rod shape failed to prevent cracking of the light transmissive member 21 and to improve reliability of the light emitting diode package 20. Further, it can be seen that the light emitting diode package containing 5 wt % or less of the reinforcing fillers 122 did not exhibit a significant difference in reliability with the conventional light emitting diode packages.

However, in all of the fourth to seventh experimental groups, cracks were generated when the experiment was performed for 1,500 hours or more. Accordingly, it can be seen that the light emitting diode package 100 including the light transmissive member 120 containing 10 wt % or more of the reinforcing fillers 122 had better reliability than the conventional light emitting diode packages 10, 20.

Further, in the fifth experimental group, cracks were generated when the experiment was performed for 2,500 hours, indicating a significant difference from the fourth experimental group in which cracks were generated when the experiment was performed for 1,500 hours. Further, in the sixth and seventh experimental groups, cracks were generated when the experiment was performed for 3,500 hours, indicating a significant difference from the fifth experimental group in which cracks were generated when the experiment was performed for 2,500 hours.

It should be noted that, when the content of the reinforcing fillers 122 exceeds 200 wt %, it is difficult to apply the reinforcing fillers 122 to experiments and packages due to increase in viscosity of the light transmissive member, which makes it difficult to form the light transmissive member.

From these experiments, it can be seen that reliability of the light emitting diode package 100 is improved when the reinforcing fillers 122 are present in an amount of 10 wt % to 200 wt % in the light transmissive member 120. In addition, in some embodiments, it can be seen that reliability of the light emitting diode package 100 is improved to a significant level when the reinforcing fillers 122 are present in an amount of 50 wt % or more in the light transmissive member 120. Further specifically, it can be seen that reliability of the light emitting diode package 100 is improved to a significant level when the reinforcing fillers 122 are present in an amount of 100 wt % or more in the light transmissive member 120.

That is, the light emitting diode package 100 according to this embodiment has improved reliability when the light transmissive member 120 includes 10 wt % to 200 wt % of the reinforcing fillers 122.

Furthermore, the light emitting diode package 100 has further improved reliability when the light transmissive member 120 includes 50 wt % to 200 wt %, or more specifically, 100 wt % to 200 wt % of the reinforcing fillers 122.

Table 2 shows luminous flux depending upon the content of the reinforcing fillers 122 in the light emitting diode package 100 according to this embodiment upon application of an electric current of 350 mA to the light emitting diode chip 110.

TABLE 2

| Kind | Luminous Flux (lm) | Remark |
| --- | --- | --- |
| First experimental group | 102.82 | 100% |
| Third experimental group | 102.61 | 99.8% |
| Fourth experimental group | 101.90 | 99.3% |
| Fifth experimental group | 100.57 | 98.7% |
| Sixth experimental group | 98.56 | 98.0% |
| Seventh experimental group | 95.41 | 96.8% |

Referring to Table 2, with reference to the luminous flux of the first experimental group not including the fillers, the luminous flux of the third to seventh experimental groups each including the reinforcing fillers 122 was decreased. The third experimental group has a difference in luminous flux of 0.2% with the first experimental group. The fourth experimental group has a difference in luminous flux of 0.7% with the first experimental group and a difference in luminous flux of 0.5% with the third experimental group. The fifth experimental group has a difference in luminous flux of 1.3% with the first experimental group and a difference in luminous flux of 0.6% with the fourth experimental group. The sixth experimental group has a difference in luminous flux of 2% with the first experimental group and a difference in luminous flux of 0.7% with the fifth experimental group. The seventh experimental group has a difference in luminous flux of 3.2% with the first experimental group and a difference in luminous flux of 1.2% with the sixth experimental group. The third to sixth experimental groups having a difference in luminous flux of 2% or less with the first experimental group have a luminous flux reduction rate of 0.7% or less as the content of the reinforcing fillers 122 increases. However, the seventh experimental group has a difference in luminous flux of 1.2% with the sixth experimental group and exhibits rapid increase in luminous flux reduction rate.

From this experiment, it can be seen that the reinforcing fillers 122 are present in an amount of 100 wt % of less in the light transmissive member 120 in order to minimize deterioration in luminous efficacy of the light emitting diode package 100.

That is, the light emitting diode package 100 according to the embodiments has improved reliability when the light transmissive member 120 includes 10 wt % to 200 wt % of the reinforcing fillers 122.

Furthermore, the light emitting diode package 100 according to the embodiments has further improved reliability when the light transmissive member 120 includes 50 wt % to 200 wt % of the reinforcing fillers 122 than when the light transmissive member 120 includes less than 50 wt % of the reinforcing fillers 122.

Furthermore, the light emitting diode package 100 according to the embodiments has significantly improved reliability while minimizing deterioration in luminous efficacy when the light transmissive member 120 includes 50 wt % to 100 wt % of the reinforcing fillers 122.

The light emitting diode package 100 may be manufactured by a method including: preparing a support substrate (not shown); placing light emitting diode chips 110 on the support substrate; forming a light transmissive member 120; polishing an upper surface of the light transmissive member 120; performing a singulation process; and removing the support substrate.

First, multiple light emitting diode chips 110 may be placed on the support substrate. Here, the multiple light emitting diode chips 110 may be placed to be separated from each other.

Then, the light transmissive member 120 may be formed on the support substrate to cover the multiple light emitting diode chips 110.

Next, the upper surface of the light transmissive member 120 may be polished. During polishing of the upper surface of the light transmissive member 120, the reinforcing fillers 122 may be exposed through the upper surface of the light transmissive member 120.

Next, the singulation process is performed by dicing the light transmissive member 120 between the light emitting diode chips 110 to provide individual light emitting diode packages 100. Here, during dicing of the light transmissive member 120, the reinforcing fillers 122 may be exposed through the side surface of the light transmissive member 120.

Next, the support substrate is removed, thereby providing the individual light emitting diode packages 100, as shown in FIG. 1.

In the following description of light emitting diode packages according to other embodiments, the same components as those of the light emitting diode package according to the above embodiment will be omitted or briefly described. For details of the omitted or briefly described components, refer to the descriptions of the above embodiment.

FIG. 5 illustrates a light emitting diode package according to a second embodiment of the present disclosure.

The light emitting diode package 200 according to the second embodiment includes a light emitting diode chip 110, a light transmissive member 120, and a barrier member 210.

The light transmissive member 120 covers upper and side surfaces of the light emitting diode chip 110. In addition, the light transmissive member 120 includes a light transmissive resin 121, reinforcing fillers 122, and a wavelength conversion material 123. The reinforcing fillers 122 and the wavelength conversion material 123 are dispersed in the light transmissive resin 121. Here, the wavelength conversion material 123 may be omitted depending upon wavelengths of light emitted from the light emitting diode chip 110.

The barrier member 210 is formed of a material capable of reflecting light and reflects light emitted from the light emitting diode chip 110. For example, the barrier member 210 may include a silicone resin, an epoxy resin, or a mixture thereof. Further, the barrier member 210 may include a reflective material, such as $TiO_2$, $SiO_2$, and $Al_2O_3$, in order to improve light transmittance.

According to this embodiment, the barrier member 210 covers a side surface of the light transmissive member 120 and exposes an upper surface of the light transmissive member 120. That is, the barrier member 210 reflects light emitted through the side surface of the light emitting diode chip 110 such that the light can be emitted through the upper surface of the light transmissive member 120. Accordingly, the barrier member 210 may improve luminous efficacy of the light emitting diode package 200 by preventing light loss through the side surface of the light emitting diode package 200.

Further, the barrier member 210 prevents foreign matter from entering the light transmissive member 120 and the light emitting diode chip 110 through the side surface of the light emitting diode package 200, thereby improving reliability of the light emitting diode package 200.

The barrier member 210 may include the reinforcing fillers 122.

The reinforcing fillers 122 have a low coefficient of thermal expansion to suppress expansion or contraction of the barrier member 210 due to temperature variation. Accordingly, the barrier member 210 can secure the light transmissive member 120 such that the light transmissive member 120 does not suffer from variation in length or volume due to temperature variation. Further, the barrier member 210 can prevent the light transmissive member 120 from being peeled off of the light emitting diode chip 110.

In addition, the reinforcing fillers 122 having an elongated rod structure can prevent foreign matter from entering the light emitting diode package 200 through the barrier member 210. Further, even when foreign matter enters the barrier member 210, the reinforcing fillers 122 having an elongated rod structure can prevent the foreign matter from reaching the light transmissive member 120 by blocking or extending an intrusion route of the foreign matter.

Accordingly, the barrier member 210 including the reinforcing fillers 122 can prevent components of the light emitting diode package 200 from being degraded due to effects of the foreign matter.

Although the barrier member 210 is illustrated as including the reinforcing fillers 122, it should be understood that the reinforcing fillers 122 can be omitted so long as it is possible to prevent deterioration in reliability of the light emitting diode package 200 while sufficiently preventing foreign matter from entering the light emitting diode package 200 even without the reinforcing fillers 122.

FIG. 6 illustrates a light emitting diode package according to a third embodiment of the present disclosure.

FIG. 7 illustrates a light emitting diode package according to a fourth embodiment of the present disclosure.

Each of the light emitting diode packages 300, 400 according to the third and fourth embodiments includes a light emitting diode chip 110, a light transmissive member 120, and a barrier member 210.

The light transmissive member 120 covers an upper surface of the light emitting diode chip 110. In addition, the light transmissive member 120 includes a light transmissive resin 121, reinforcing fillers 122, and a wavelength conversion material 123. The reinforcing fillers 122 and the wavelength conversion material 123 are dispersed in the light transmissive resin 121. Here, the wavelength conversion material 123 may be omitted depending upon wavelengths of light emitted from the light emitting diode chip 110.

Referring to FIG. 6, in the light emitting diode package 300 according to the third embodiment, the barrier member 210 covers a side surface of the light emitting diode chip 110 and a side surface of the light transmissive member 120.

Referring to FIG. 7, in the light emitting diode package 400 according to the fourth embodiment, the barrier member 210 is disposed at a lower side of the light transmissive member 120 and covers a side surface of the light emitting diode chip 110. That is, in the light emitting diode package 400 according to the fourth embodiment, the light transmissive member 120 covers an upper surface of the light emitting diode chip 110 and an upper surface of the barrier member 210.

The barrier member 210 is formed of a material capable of reflecting light and reflects light emitted from the light emitting diode chip 110. For example, the barrier member 210 may include a silicone resin, an epoxy resin, or a mixture thereof. Further, the barrier member 210 may include a reflective material, such as $TiO_2$, $SiO_2$, and $Al_2O_3$, in order to improve light transmittance.

The barrier member 210 may include the reinforcing fillers 122 dispersed therein. The barrier member 210 including the reinforcing fillers 122 can secure the light transmissive member 120 such that the light transmissive member 120 does not suffer from variation in length or volume due to temperature variation. In addition, the reinforcing fillers 122 of the barrier member 210 can prevent foreign matter from entering the light emitting diode packages 300, 400 through the barrier member 210.

According to the third and fourth embodiments, the barrier member 210 covers the side surface of the light emitting diode chip 110 to reflect light emitted through the side surface of the light emitting diode chip 110. Light emitted through the side surface of the light emitting diode chip 110 is reflected by the barrier member 210 to travel towards the light transmissive member 120 disposed at an upper side of the light emitting diode chip 110.

Therefore, in the light emitting diode packages 300, 400 according to the third and fourth embodiments, the barrier member 210 can prevent light loss through the side surface of each of the light emitting diode packages 300, 400, thereby improving luminous efficacy.

Although some embodiments have been described herein with reference to the accompanying drawings, it should be understood that these embodiments are provided for illustration only and are not to be construed in any way as limiting the present disclosure. Therefore, it should be understood that the scope of the present disclosure should be defined by the appended claims and equivalents thereto.

What is claimed is:

1. A light emitting package, comprising:
a light emitting chip emitting light; and
a light transmissive layer covering an upper surface of the light emitting chip and comprising a light transmissive resin and a plurality of first fillers,
a barrier covering a side surface of the light transmissive layer and including second fillers in the barrier,
wherein the plurality of first fillers is dispersed in the light transmissive resin,
wherein the barrier exposes an upper surface of the light transmissive layer,
wherein the plurality of first fillers includes at least one of Si, Al, Fe, Ba, Ca, Mg, or Na and the second fillers include at least one of Si, Al, Fe, Ba, Ca, Mg, or Na, and
wherein the plurality of first fillers is exposed through the upper surface and side surfaces of the light transmissive layer.

2. The light emitting package of claim 1, wherein the plurality of first fillers includes at least one of $SiO_2$, $Al_2O_3$, MgO, CaO, $Na_2O$, $K_2O$, or $B_2O_3$.

3. The light emitting package of claim 1, wherein the light transmissive layer is free of wavelength conversion material including phosphors or quantum dots (QD).

4. The light emitting package of claim 1, wherein the plurality of first fillers is present in an amount of 10 wt % to 200 wt % relative to the light transmissive resin, wherein wt % indicates a weight percent of the plurality of first fillers.

5. The light emitting package of claim 1, wherein at least one of the plurality of first fillers has at least two side surfaces having different lengths from each other.

6. The light emitting package of claim 1, wherein the light transmissive resin has a higher coefficient of thermal expansion than that of the light emitting chip.

7. The light emitting package of claim 1, wherein the light transmissive layer is extended to be disposed on sides of the light emitting chip such that a thickness from a side surface of the light emitting chip to the side surface of the light transmissive layer is greater than a thickness from the upper surface of the light emitting chip to the upper surface of the light transmissive layer.

8. A light emitting package, comprising:
a light emitting chip emitting light; and
a light transmissive layer covering an upper surface of the light emitting chip, the light transmissive layer including a light transmissive resin and first fillers dispersed in the light transmissive resin,
a barrier covering a side surface of the light transmissive layer and including second fillers dispersed in the barrier,
wherein a light emitted from the light transmissive layer has a wavelength band, and
wherein the first fillers and the second fillers include at least one of Si, Al, Fe, Ba, Ca, Mg, or N, and
wherein the first fillers are exposed through an upper surface and side surfaces of the light transmissive layer.

9. The light emitting package of claim 8, wherein the first fillers and the second fillers include at least one of $SiO_2$, $Al_2O_3$, MgO, CaO, $Na_2O$, $K_2O$, or $B_2O_3$.

10. The light emitting package of claim 8, wherein the light transmissive layer is free of wavelength conversion material including phosphors or quantum dots (QD).

11. The light emitting package of claim 8, wherein the first fillers are present in an amount of 10 wt % to 200 wt % relative to the light transmissive resin, wherein wt % indicates a weight percent of the first fillers.

12. The light emitting package of claim 8, wherein at least one of the first fillers and the second fillers has at least two side surfaces having different lengths from each other.

13. The light emitting package of claim 8, wherein the light transmissive resin has a higher coefficient of thermal expansion than that of the light emitting chip.

14. The light emitting package of claim 8, wherein the light transmissive layer is extended to be disposed on sides of the light emitting chip such that a thickness from a side surface of the light emitting chip to the side surface of the light transmissive layer is greater than a thickness from the upper surface of the light emitting chip to the upper surface of the light transmissive layer.

15. The light emitting package of claim 8, wherein the barrier includes at least one of a silicone resin or an epoxy resin.

16. A light emitting package, comprising:
a light emitting chip emitting light; and
a light transmissive layer covering an upper surface and one or more side surfaces of the light emitting chip, the light transmissive layer including a light transmissive resin and first fillers dispersed in the light transmissive resin,
a barrier covering a side surface of the light transmissive layer and including second fillers in the barrier,
wherein at least one of the first fillers has at least two side surfaces including different lengths; and
wherein a light emitted from the light transmissive layer has a wavelength band, and
wherein the first fillers and the second fillers include at least one of Si, Al, Fe, Ba, Ca, Mg, or Na, and
wherein the first fillers are exposed through an upper surface and side surfaces of the light transmissive layer.

17. The light emitting package of claim 16, wherein the first fillers comprise at least one of $SiO_2$, $Al_2O_3$, MgO, CaO, $Na_2O$, $K_2O$, or $B_2O_3$.

18. The light emitting package of claim 16, wherein the light transmissive layer is free of wavelength conversion material including phosphors or quantum dots (QD).

19. The light emitting package of claim 16, wherein the first fillers are present in an amount of 10 wt % to 200 wt % relative to the light transmissive resin, wherein wt % indicates a weight percent of the first fillers.

* * * * *